United States Patent
Katakura

[11] Patent Number: 5,912,095
[45] Date of Patent: Jun. 15, 1999

[54] MASK SUBSTRATE MANUFACTURING METHODS

[75] Inventor: Norihiro Katakura, Kawasaki, Japan

[73] Assignee: Nikon Corporation, Tokyo, Japan

[21] Appl. No.: 08/868,454

[22] Filed: Jun. 3, 1997

[30] Foreign Application Priority Data

| Jun. 4, 1996 | [JP] | Japan | 8-141446 |
| Aug. 8, 1996 | [JP] | Japan | 8-209894 |
| Mar. 11, 1997 | [JP] | Japan | 9-056170 |

[51] Int. Cl.$^6$ .................................................. G03F 9/00
[52] U.S. Cl. ................... 430/5; 378/35; 430/296
[58] Field of Search .................... 430/5, 296; 378/34, 378/35

[56] References Cited

U.S. PATENT DOCUMENTS

| 5,096,791 | 3/1992 | Yahalom | 430/5 |
| 5,115,456 | 5/1992 | Kimura et al. | 378/35 |
| 5,178,977 | 1/1993 | Yamada et al. | 430/5 |
| 5,798,194 | 8/1998 | Nakasuji et al. | 430/5 |

FOREIGN PATENT DOCUMENTS

2-170410  7/1990  Japan .

*Primary Examiner*—S. Rosasco
*Attorney, Agent, or Firm*—Klarquist Sparkman Campbell Leigh & Whinston, LLP

[57] ABSTRACT

Methods for manufacturing mask substrates usable to make masks for use with charged particle beam or X-ray microlithography. Such masks have supports that are formed to have a minimum required width. The method involves forming a planar laminate of a membrane layer (destined to be the membrane of the mask), an etch-stopper layer, and a support-forming silicon layer. An etch-resistant layer is applied to the silicon layer, and a support-defining pattern is imposed on the etch-resistant layer by, e.g., a microlithographic technique. The resulting exposed portions of the silicon layer are removed by anisotropic dry etching (preferably plasma-enhanced dry etching at extremely low temperature or in the presence of a side-wall protective gas). The dry etching continues until the etch-stopper layer is reached. The resulting mask substrate has well defined supports with side walls perpendicular to the plane of the membrane.

23 Claims, 3 Drawing Sheets

MASK SUBSTRATE MANUFACTURING METHODS

FIELD OF THE INVENTION

This invention pertains to methods for making masks as used in photolithography using X-rays or charged-particle beams.

BACKGROUND OF THE INVENTION

The resolution of an optical system, including a projection optical system as used in microlithography, is limited by diffractive limitations of the wavelength of electromagnetic radiation used to make the exposure. In recent years, with the increased miniaturization of semiconductor integrated circuit elements, the limitations of using visible or ultraviolet light for microlithography have become apparent. For improved resolution, microlithography techniques have been developed that use X-rays, electron beams or charged particle beams, such as ion beams, etc. (Herein, beams of electrons or of ions are collectively referred to as "charged particle beams".)

X-rays and charged particle beams have shorter wavelengths than the visible or ultraviolet illumination light conventionally used for microlithography. Thus, X-rays and charged particle beams are potentially able to provide more resolution and thus to project more intricate circuit patterns (i.e., greater circuit density and smaller feature size) onto a wafer than ultraviolet or visible-light microlithography methods.

In order to project a circuit pattern, a mask defining the circuit pattern is required. A representative portion of a conventional mask 41 is shown in FIG. 6, particularly for use with a charged particle beam. The mask 41 comprises a membrane 42, transmissive to the charged particle beam, on which supports 43 are formed. The supports 43 provide the mask 41 with sufficient rigidity to ensure that the mask remains planar during use. The mask 41 is divided into multiple subfields 44 separated from one another by boundary regions 45. The boundary regions are situated opposite the supports 43 on an opposing surface of the membrane 42. Each subfield 44 defines features 46 of the corresponding portion of the overall pattern defined by the mask.

In the mask 41 shown in FIG. 6, the supports 43 are conventionally formed by selectively etching a layer of monocrystalline silicon with a suitable silicon-etching solution (see, e.g., Japan Kôkai patent publication no. HEI 2-170410). The supports 43 are typically etched in their height dimension by exploiting a difference in etching rates of the (100) plane versus the (111) plane of the monocrystalline silicon. For example, the wall surface 43a of the support 43 is conventionally the (111) plane of crystalline silicon which is normally tilted at 54.7° relative to the plane of the membrane 42. Etching to form the supports 43 preserves this inclination which leaves the supports 43 wider than required for rigidity and thus undesirably increases the surface area of the mask 41.

Whenever the illumination source for the mask produces divergent rays (such as X-rays), the inclination of the walls 43a can function as a relief for the divergence of the X-rays. In such instances, the width of the supports 43 does not pose a serious problem.

However, masks as described above are not limited to divergent X-rays. i.e., such masks can be used with charged particle beams or with X-rays produced from synchrotron radiation-beam sources. Such illumination methods exhibit extremely small divergence angles. In such instances, inclination of the support walls 43a provides no benefit because the illumination beam perpendicularly illuminates the mask. In addition, the increased mask size from inclining the walls 43a can have a substantial adverse effect, such as necessitating larger optics to accommodate the larger mask field and the need to use mask stages having a wider range of movement.

As shown in FIG. 7, in conventional pattern transfer methods employing charged particle beams, the patterns defined in the subfields 44a–44d on the mask 41 are transferred to corresponding regions 48a–48d on the wafer 47 or other suitable substrate. During transfer of the subfield patterns, the portions of the mask 41 occupied by the boundary regions 45 (and thus by the supports 43 underlying the boundary regions) are not transferred. Rather, the subfields are "stitched" together on the surface of the wafer 47 so that the subfield patterns interconnect with each other on the wafer surface in a manner that produces the desired overall pattern. The subfields 44a–44d on the mask 41 are normally transferred by projection of a demagnified image of the subfields using a suitable optical system (not shown). To eliminate projection of the boundary regions 45 onto the wafer 47, the optical system provides the charged particle beam or X-ray passing through the mask with an additional deflection equal to the width of the boundary region 45. This permits each of the projected subfields on the wafer 47 to be "stitched" together in a manner such that the boundary regions do not appear on the wafer. Unfortunately, an increased deflection distortion can accompany such additional deflection. Because such distortion can have a significant detrimental effect on the transfer accuracy, there is a need for masks in which the boundary regions 45 (and thus the supports 43) are as narrow as possible.

SUMMARY OF THE INVENTION

This invention addresses the foregoing shortcomings of the prior art. An object of this invention is to provide a method for making a mask substrate in which the supports are formed with the minimum width necessary to provide the mask with adequate support.

To such end, the present invention provides, inter alia, manufacturing methods for making a mask substrate. According to a preferred embodiment of a method according to the invention, a planar laminate is formed that comprises a membrane layer, an etch-stopper layer applied to the membrane layer, and a support-forming silicon layer applied to the etch-stopper layer. An etch-resistant layer is applied to the support-forming layer. Portions of the etch-resistant layer are selectively removed so as to form a support pattern in the etch-resistant layer. The support pattern is defined by remaining portions of the etch-resistant layer and exposed portions of the support-forming layer. The exposed portions of the support-forming layer are anisotroptically dry etched away to the etch-stopper layer so as to form the support-forming layer into supports for the mask substrate according to the support pattern.

According to another aspect of the invention, manufacturing methods are provided for making a mask substrate. The methods include the step of preparing the substrate made by sequentially laminating separate layers of, at least, silicon, an etch-stopping material, and a membrane-forming material. A silicon oxide layer is applied to the silicon layer, and a desired pattern is formed in the silicon oxide layer. The silicon layer is dry etched to match the pattern in the silicon oxide layer. The layer of etch-stopping material is removed to match the pattern in the silicon oxide layer.

According to another aspect of the invention, the etch-stopper layer is preferably silicon oxide or a metallic thin film.

According to another aspect of the invention, a mask manufacturing method is provided in which the dry etching step can be performed by plasma dry etching performed at an extremely low temperature.

According to yet another aspect of the invention, a mask manufacturing method is provided in which the dry-etching step is performed under side-wall protective conditions, even at temperatures higher than extremely low temperatures.

The foregoing and other objects, features and advantages of the invention will become more apparent from the following detailed description of preferred embodiments which proceeds with reference to the accompanying drawings.

DETAILED DESCRIPTION OF THE PREFERRED EMBODIMENTS

Figure 1:
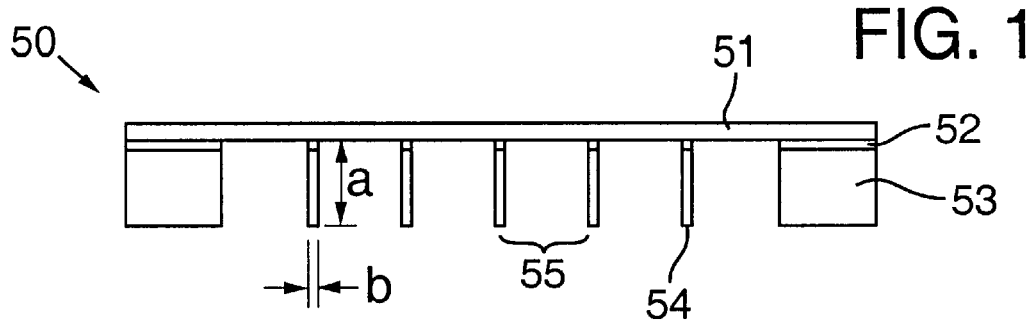
FIG. 1 is a schematic cross section of a mask prepared according to the invention.

A representative and preferred embodiment of a mask substrate 50 prepared according to the invention is shown in FIG. 1. (As used herein, a "mask substrate" is a substrate on which the desired mask pattern is formed.) The mask substrate 50 comprises a "membrane" 51. (The "membrane" is the layer of the mask on which the mask pattern is formed.) The membrane 51 is preferably made of a material such as, by way of example, $Si_3N_4$, Be, C (diamond), SiC, $Al_2O_3$, Al, Si, and $SiO_2$, etc. The membrane 51 can be amorphous or metallic, depending upon whether the mask substrate 50 will be used with an X-ray or charged particle beam illumination.

The mask substrate 50 of FIG. 1 preferably comprises a first layer 52 applied to the underside of the membrane 51. As described further below, the first layer 52 serves as an etch-stopper layer during fabrication of the mask substrate 50. The first (i.e., etch-stopper) layer 52 may be omitted if the depth of etching during an anisotropic dry-etching step can be accurately controlled by, e.g., controlling the time during which the anisotropic dry-etching is allowed to proceed. Extending from the first layer 52 are supports 54. Narrow supports 53 divide the various subfields 55 on the mask substrate 50 from each other.

Figure 3:
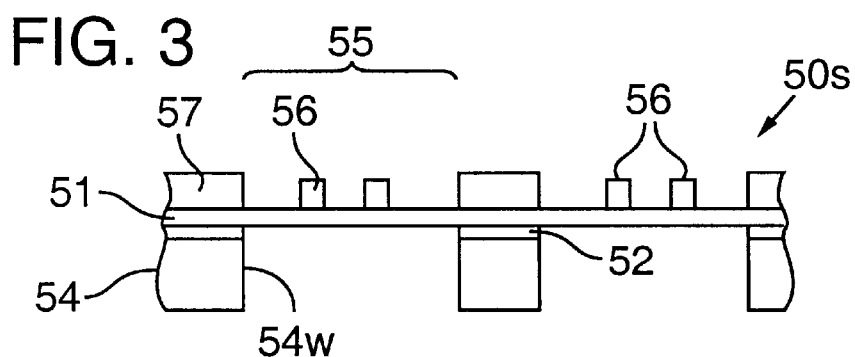
FIG. 3 is a schematic cross section of a mask made according to the invention, the mask including a membrane on which regions are formed that absorb or scatter the illuminating radiation.

Referring now to FIG. 3, a scattering mask 50s according to the invention is shown. The scattering mask 50s comprises multiple subfields 55 each including blocking, absorbing, or scattering regions 56 formed on the membrane 51. Whenever the mask 50s is to be used as an X-ray scattering mask, the thickness of the membrane 51 is preferably approximately 1 to 3 μm. Whenever the mask 50s is to be used as a scattering mask for a charged particle beam, the thickness of the membrane 51 is preferably approximately 30 to 50 nm. The mask 50s includes supports 54 having side walls 54w. Above the supports 54 are corresponding boundary regions 57. The supports 54 add rigidity to the mask 50s and, together with the boundary regions 57, divide the subfields 55 from each other.

Figure 4:
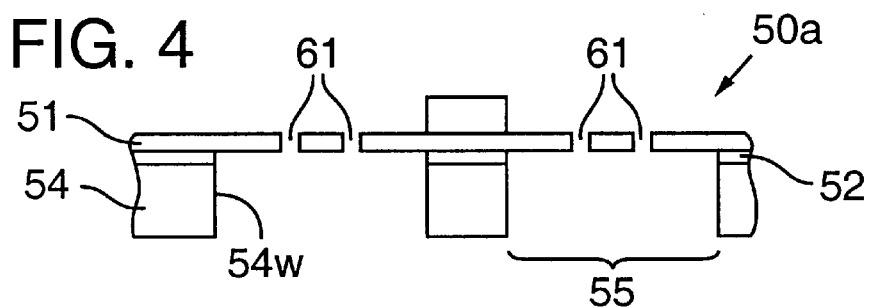
FIG. 4 is a schematic cross section of a mask made according to the invention, the mask including a membrane defining apertures transmissive to the illuminating radiation.

Referring now to FIG. 4, an aperture mask 50a according to the present invention is shown. The aperture mask 50a comprises a membrane 51 that defines transmission apertures 61 through which the illumination radiation passes. Other regions of the membrane 51 scatter or absorb the illumination radiation. The mask 50a is divided into multiple subfields 55 by supports 54 having side walls 54w. Whenever the illumination radiation is to be scattered by regions of the membrane not including the apertures 61, the membrane thickness is preferably approximately 1.5 to 2.5 μm. Whenever the illumination radiation is to be absorbed by regions of the membrane not including the apertures 61, the membrane thickness is preferably approximately 20 to 30 nm.

Figure 5A:
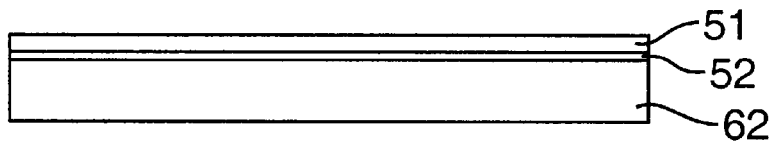
FIGS. 5(a)–5(e) schematically illustrate in a sequential manner a representative embodiment of a mask manufacturing method according to the invention.
Figure 5B:
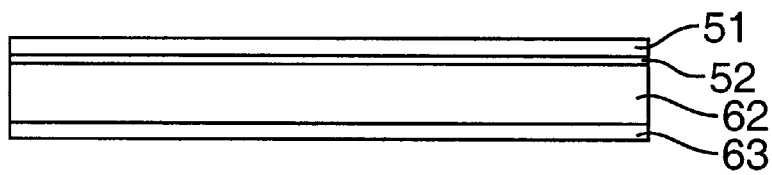
Figure 5C:
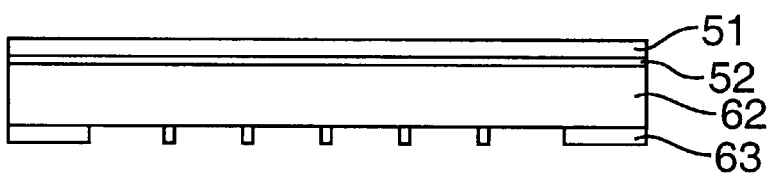

A representative and preferred embodiment of a method for manufacturing a mask substrate according to the invention is illustrated in FIGS. 5(a)–5(e). In FIG. 5(a), a laminate is formed of a suitable membrane material 51, a first layer 52 (preferably comprising either silicon oxide or metal thin film), and a second layer 53 (preferably comprising silicon). A third layer 63 (preferably silicon dioxide) is then applied (FIG. 5(b)). As stated above, the first layer serves as an "etch stopper" layer and can be omitted if the depth of etching during an anisotropic dry etching step can be accurately controlled by, e.g., controlling the time during which the anisotropic dry etching step is allowed to proceed.

The third layer 63 can be formed by any of various techniques such as chemical vapor deposition (CVD) and ion-beam sputtering. Alternatively, the third layer 63, if silicon dioxide, can be formed by any of various techniques involving heating of the surface of the second (silicon) layer 62 in an air atmosphere.

A resist layer (not shown) is then applied to the third layer 63 which is exposed to cause the resist layer to define a desired pattern for subsequent steps. The resist is preferably exposed by microlithography (FIG. 5(c)). The third layer 62 is then etched according to the pattern in the resist by, preferably, a dry etching technique (wherein the pattern is used as an etching mask) (FIG. 5(d)). This etching forms the supports 53, 54.

Dry etching to form the supports 53, 54 is preferably performed by plasma-enhanced dry etching using a reactive gas. In plasma-enhanced dry etching, etching is performed by active radicals and ions produced by excitation of the reactive gas in the plasma. During such etching, a voltage gradient is typically applied in the direction perpendicular to the plane of the membrane 51, which causes radicals and ions to move predominantly in directions parallel to the voltage gradient. Nevertheless, at temperatures other than "extremely low temperatures", reactive radicals produced by interaction of molecules of the reactive gas with the plasma are kinetically very energetic and tend to react with the side walls.

One preferred way in which to perform dry etching in methods according to the present invention is at an extremely low temperature, which suppresses reaction of radicals with the side walls 53w, 54w and thus facilitates anisotropic etching.

By "extremely low temperature" is meant a temperature preferably in the range of −100° C. to −120° C., or lower. If the etching temperature is higher than about −100° C. without taking other precautions, anisotropic etching by the radicals can be difficult to control, making true vertical etching impossible.

According to the present invention, plasma-enhanced dry etching can be performed at temperatures higher than an "extremely low temperature", even at room temperature or higher temperatures, and still provide the desired anisotropic etching. As stated above, such higher-temperature etching would normally allow the radicals to etch in an isotropic, rather than an anisotropic fashion. Such elevated temperature plasma-enhanced dry etching is performed using a "side-wall protective gas" that generates certain reaction products in the plasma that tend to adhere to the side walls 53w, 54w, thereby inhibiting etching into the side walls.

By way of example, during side-wall protective plasma dry etching, a mixed gas of silicon etching gas and a "side-wall protective gas" is introduced. Etching is performed in the vertical direction while the side walls 53w, 54w are protected with reaction products formed from the side-wall protective gas. To effect such protection, the side-wall protective gas forms a polymer during etching.

Examples of mixed gases for sidewall-protective dry etching include, but are not limited to, $Cl_2$+$CHF_3$ and $SF_6$+$C_3H_8$. The silicon in the second layer 62 is etched in the vertical direction by action of the $Cl_2$ or $SF_6$. Etching in the direction of the side walls 53w, 54w is suppressed by the formation of a protective film on the side walls by polymerization of the $CHF_3$ or $C_3H_8$.

The first layer 52 (if present) between the membrane 51 and the second layer 62 acts as an etch stopper. I.e., the first layer 52 stops etching when etching has proceeded through the second layer 62.

As stated above, the first layer 52 can be silicon oxide. Candidate metal thin films that can be used as the first (etch-stopper) layer 52 are, e.g., Ni, Al, or Cr.

The thickness of the etch-stopper layer 52 should be sufficient for the layer 52 to perform as an etch stopper. By way of example, a preferable thickness range is approximately 0.5 μm to 1.5 μm.

Figure 5D:
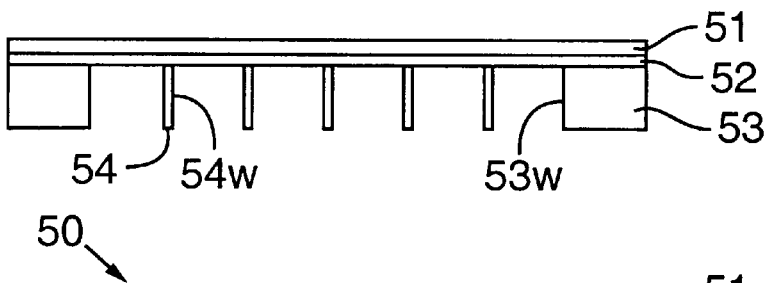
Figure 5E:
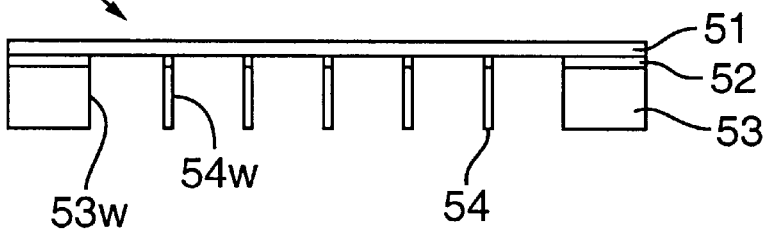
Figure 6:
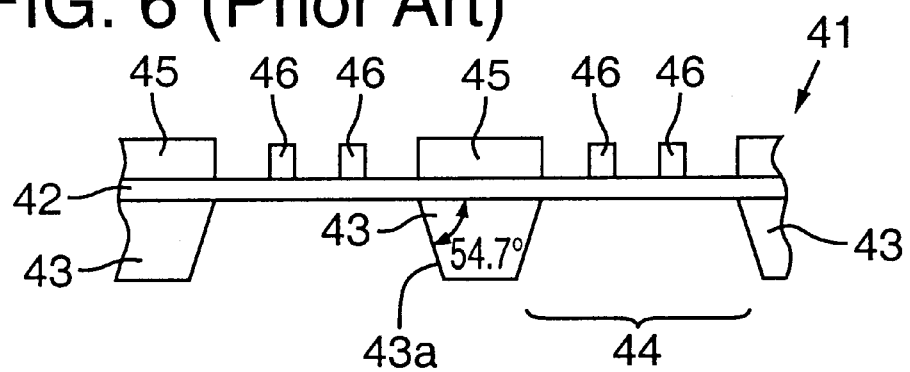
FIG. 6 schematically illustrates, in cross section, general features of a conventional mask for X-ray or charged particle illumination.
Figure 7:
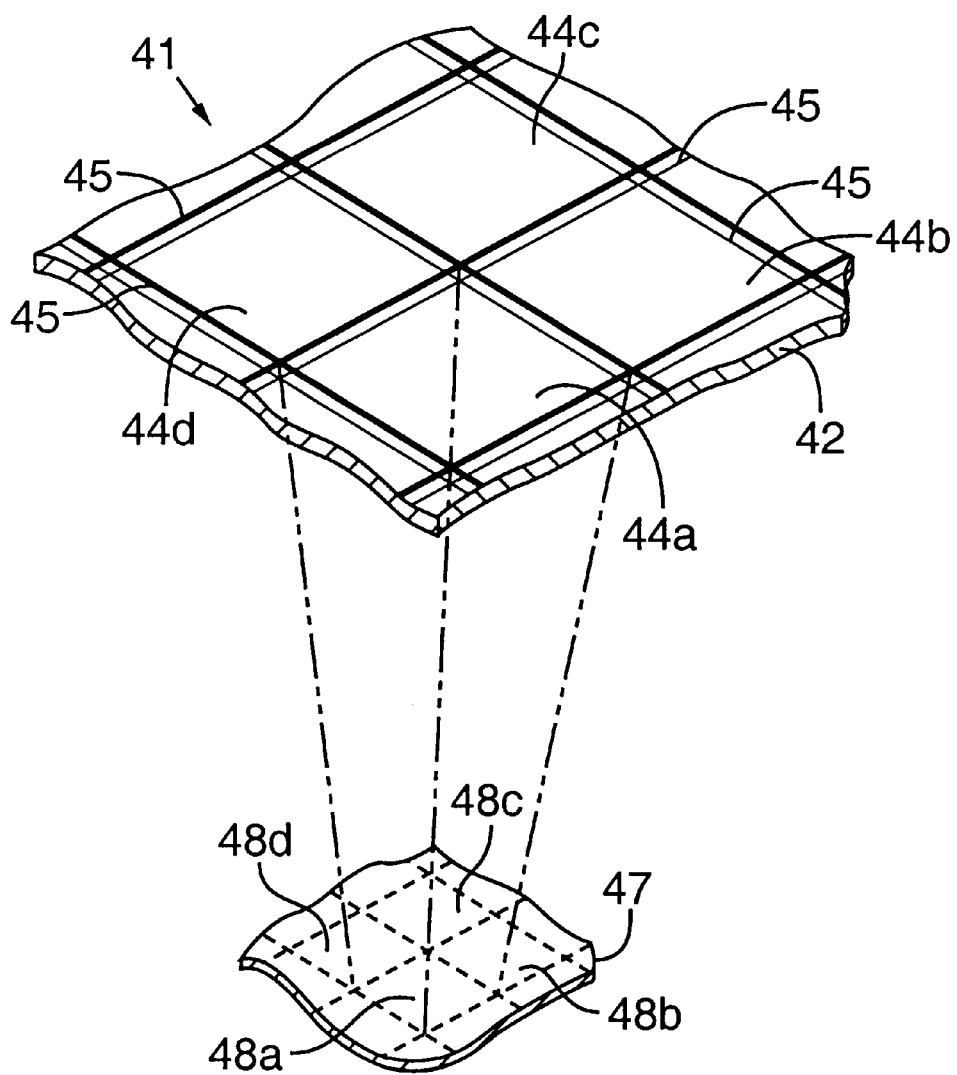
FIG. 7 schematically illustrates the conventional manner in which subfields on a mask are transferred to a substrate using a charged particle beam.

If silicon oxide is used as the etch-stopper layer 52, manufacture of the mask substrate is complete after removal from the etching step (FIG. 5(e)).

If a metal film is used as the etch-stopper layer 52, residual metal film exposed after etching can be removed by another etch step or by, e.g., electrolytic polishing.

EXAMPLE EMBODIMENTS

Example Embodiment 1

In this example embodiment, the membrane 51 was silicon, 2 μm thick. The first layer 52 was 1 μm thick silicon oxide. The second layer 62 was 1 mm thick silicon. The third layer 63 was 10 μm thick silicon oxide formed by CVD. Next, a resist was applied to the third layer 63, and a grid pattern was transferred to the third layer by photolithography. The third layer 63 was dry-etched. A fourth layer of silicon oxide was applied and used as an etch mask, followed by etching of the second layer 62 by plasma dry etching using $SF_6$ as the reactive gas at −120° C. substrate temperature and 2.7 Pa pressure.

Plasma etching of the second (silicon) layer 62 was completed when the etching reached the first layer (silicon oxide) 52 acting as the etch-stopper layer.

Residual exposed portions of the first layer 52 were etched away by plasma etching using $CHF_3$ as the reactive gas under the same conditions as the previous etch.

Finally, the resulting mask substrate 50 (FIG. 5(e)) was rinsed with a mixture of nitric acid and aqueous hydrogen peroxide, then with demineralized water, then dried.

Figure 2:
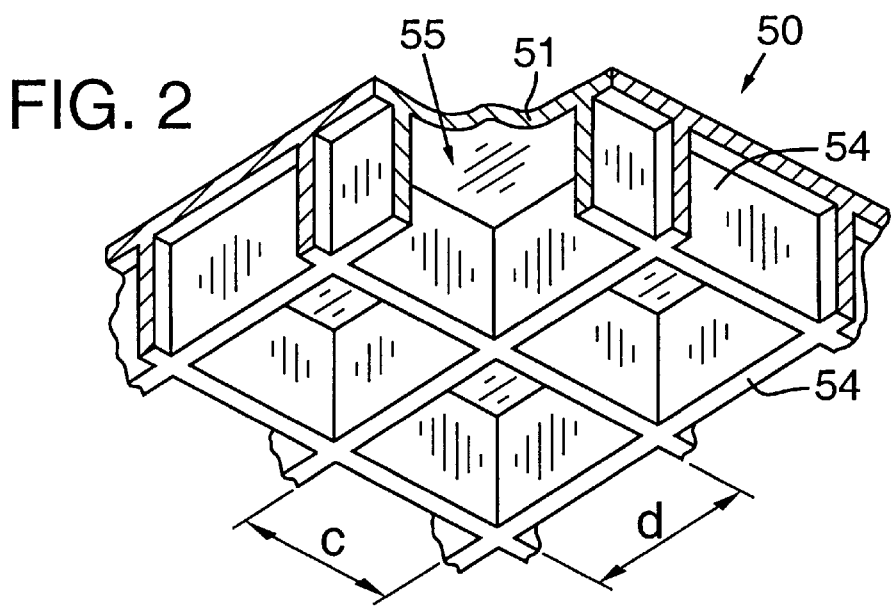
FIG. 2 is an oblique-view showing certain features of a mask prepared according to the invention, as viewed from the bottom.

FIGS. 1 and 2 are a schematic cross sectional view and an oblique view, respectively, of a mask substrate 50 prepared according to Example Embodiment 1. The height a of the supports 53, 54 formed from the first (silicon) layer 53 is 1 mm. The width b of the supports 54 is 0.5 mm. The dimensions c and d of the subfield 55 surrounded by the supports 54 is 10 mm and 10 mm, respectively.

Since the supports 53, 54 were formed by plasma dry etching at extremely low temperature, the supports 54 were formed having minimum thickness.

Example Embodiment 2

In this Example Embodiment, the membrane 51 was a 2 μm thick SiC layer. The first layer 52 was a 1 μm thick Ni layer. The second layer 62 was a 1 mm thick silicon layer. The third layer 63 was a 10 μm thick silicon oxide layer formed by CVD on the second layer 62.

Next, a resist was applied to the third layer 63, and a grid pattern was transferred to the resist layer by photolithography. The third layer (silicon oxide) 63 was etched to produce the pattern by a dry etching technique.

Using the patterned third layer (silicon oxide) as a mask, the second layer (silicon) 62 was etched by plasma dry etching using $SF_6$ as the reactive gas at −120° C. substrate temperature and 2.7 Pa pressure. Plasma etching of the second layer 62 was completed when the etchant reached the first (Ni) layer 52 which acted as the etch-stopper material.

Residual exposed portions of the first layer 52 were removed by electrolytic polishing at 1 to 4 $mA/cm^2$ current density, 3 to 4 pH, and 50° C. solution temperature. The electrolytic polishing solution was an aqueous solution of 450 g/L nickel sulfamate, 30 g/L boric acid and 0.5 g/L sodium lauryl sulfate.

The resulting mask substrate 50 was rinsed with (a) a mixture of nitric acid and aqueous hydrogen peroxide, then with (b) demineralized water, and dried.

FIGS. 1 and 2 are representative schematic sectional and oblique views, respectively, of a mask substrate 50 prepared according to this Example Embodiment. The height a of the supports 53, 54 from the membrane 51 is 1 mm, the width b is 0.5 mm, and the dimensions c and d of the subfield 55 surrounded by the supports 54 is 10 mm and 10 mm, respectively.

Since the supports 53, 54 are formed by plasma dry etching at extremely low temperature, the supports 53, 54 are vertical, and the supports 54 have a minimum thickness to confer the required rigidity to the mask substrate 50.

Example Embodiment 3

In this Example Embodiment, the membrane 51 was a 2 μm thick silicon layer. The first layer 52 was a 1 μm thick Cr layer. The second layer 62 was a 1 mm thick silicon layer.

The third layer 63 was a 10 μm thick silicon oxide layer formed by CVD on the second layer 62.

Next, a resist layer was applied to the third layer 63. A grid pattern was transferred to the resist layer by photolithography. The third layer 63 was etched with the pattern by a dry etching technique.

Using the resist (silicon oxide) layer as a mask, the second layer 62 was etched by plasma dry etching using $SF_6$ as the reactive gas at −120° C. substrate temperature and 2.7 Pa pressure.

Plasma etching of the second (silicon) layer 62 was completed with the first (Cr) layer 52 acting as the etch-stopper material.

Remaining exposed portions of the first (Cr) layer 52 were then etched away using a mixed solution of ceric ammonium oxalate and perchloric acid.

Finally, the mask substrate was rinsed with a mixture of nitric acid and aqueous hydrogen peroxide, then with demineralized water, then dried.

FIGS. 1 and are a schematic cross section and an oblique view, respectively, of a mask substrate prepared according to Example Embodiment 3. The height a of the supports 53, 54 from the membrane 51 is 1 mm. The width b of the supports 54 is 0.5 mm. The dimensions c and d of the subfield 55 surrounded by the supports 54 are 10 mm and 10 mm, respectively.

Since the supports in the mask substrate prepared by the above process are formed by plasma dry etching at extremely low temperature, vertical supports having minimum required thickness can be obtained.

Example Embodiment 4

In this Example Embodiment, the membrane 51 was a 2 μm thick silicon layer. The first layer 52 was a 1 μm thick silicon oxide layer. The second layer 62 was a 1 mm thick silicon layer. The third layer 63 was a 10 μm thick silicon oxide layer formed by CVD on the second layer 62.

Next, a resist was applied to the third (silicon oxide) layer 63. A grid pattern was transferred to the resist layer by photolithography. The third layer 63 was then etched by a dry etching technique (FIG. 5(c)).

Using the etched third layer 63 as a mask, the second (silicon) layer 62 was etched by side-wall-protective plasma dry etching, using a mixture of $Cl_2+CHF_3$ as the reactive gas at room temperature and at 1 Pa pressure.

Plasma etching of the second (silicon) layer was complete when the etching reached the second (silicon oxide) layer 52 acting as the etch-stopper (FIG. 5(d)).

Residual exposed portions of the second (silicon oxide) layer 52 were etched away by plasma dry etching, using $CHF_3$ as the reactive gas (FIG. 5 (e)).

The resulting mask substrate 50 was rinsed with a mixture of nitric acid and aqueous hydrogen peroxide, then with demineralized water, then dried.

FIGS. 1 and 2 are schematic sectional and oblique views, respectively, of the mask substrate 50 prepared according to Example Embodiment 4. The height a of the supports 53, 54 from the membrane 51 is 1 mm, and the width b of the supports 54 is 0.5 mm. The dimensions c and d of the subfield 55 surrounded by the supports 54 is 10 mm and 10 mm, respectively.

Since the supports 53, 54 in the mask substrate 50 prepared according to this example embodiment were formed by plasma dry etching at extremely low temperature, vertical supports of the minimum required thickness can be obtained.

Example Embodiment 5

In this Example Embodiment, the membrane 51 was a 2 μm thick SiC layer. The first layer 52 was a 1 μm thick Ni layer. The second layer 62 was a 1 mm thick silicon layer. The third layer 63 was a 10 μm thick silicon oxide layer formed by CVD on the second layer 62.

A resist was applied to the third layer 63, and a grid pattern was transferred to the resist by photolithography. The third (silicon oxide) layer 63 was etched with that pattern by a dry etching technique (FIG. 5(c)).

Using the etched third layer 63 as a mask, the second (silicon) layer 62 was etched by side-wall protective plasma dry etching, using a mixed gas of $Cl_2+CHF_3$ as the reactive gas at room temperature and 1 Pa pressure.

Plasma etching of the second (silicon) layer 62 was completed when the etching reached the first (Ni) layer 52 acting as the etch-stopper layer (FIG. 5(d)).

Residual exposed portions of the first (Ni) layer 52 were removed by electrolytic polishing under conditions of 1 to 4 $mA/cm^2$ current density, 3 to 4 pH, and 50° C. (FIG. 5(e)). The electrolytic polishing solution was an aqueous solution of 450 g/L nickel sulfamate, 30 g/L boric acid, and 0.5 g/L sodium lauryl sulfate.

The resulting mask substrate was rinsed with a mixture of nitric acid and aqueous hydrogen peroxide, then with demineralized water, then dried.

The physical details of the mask substrate are shown in FIGS. 1 and FIG. 2. The dimensions are as discussed above in Example Embodiments 1–4.

Example Embodiment 6

In this Example Embodiment, the membrane 51 was a 2 μm thick silicon layer. The first layer 52 was a 1 μm thick Cr layer. The second layer 62 was a 1 mm thick silicon layer. The third layer 63 was a 10 μm thick silicon oxide layer formed by CVD on the second layer 62.

A resist was applied to the third (silicon oxide) layer 63. A grid pattern was transferred to the resist by photolithography. The third layer 63 was etched by dry etching to form the pattern (FIG. 5(c)).

Using the patterned third layer 63 as a mask, the second (silicon) layer 62 was etched by side-wall protective plasma dry etching, using a gas mixture of $Cl_2+CHF_3$ as the reactive gas at room temperature and 1 Pa pressure.

The plasma-enhanced dry etching of the second layer 62 was completed when the etching reached the first (Cr) layer 52 which acted as the etch-stopper material (FIG. 5(d)).

Residual exposed regions of the first layer 52 were etched away using a mixed solution of ceric ammonium oxalate and perchloric acid (FIG. 5(e)).

The resulting mask substrate 50 was rinsed with a mixture of nitric acid and aqueous hydrogen peroxide, then with demineralized water, and then dried.

The physical details of the mask substrate are shown in FIGS. 1 and FIG. 2. The dimensions are as discussed above in Example Embodiments 1–4.

It will be appreciated that the representative dimensions stated in Example Embodiments 1–6 are not limiting. The actual dimensions can be varied over a wide range according to specific need.

Thus, methods according to the invention allow formation of supports and other features on the mask substrate having side walls that are perpendicular relative to the plane of the membrane. This allows production of masks that can be used for performing pattern transfer using a charged particle beam or X-rays generated by synchrotron radiation.

Whereas the invention has been described in connection with preferred embodiments and multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A method for making a mask substrate used for making a mask for charged-particle beam or X-ray lithography, the method comprising:

(a) forming a planar laminate comprising a membrane layer and a support-forming silicon layer, the silicon layer having a thickness dimension;

(b) applying an etch-resistant layer to the support-forming layer;

(c) selectively removing portions of the etch-resistant layer so as to form a support pattern in the etch-resistant layer, the support pattern defined by remaining portions of the etch-resistant layer and exposed portions of the support-forming layer and dividing the mask into a plurality of subfields; and (d) anisotropically dry etching the exposed portions of the support-forming layer through the thickness dimension of the support-forming layer so as to form the support-forming layer into supports for the mask substrate according to the support pattern.

2. The method of claim 1, wherein, in step (a), the planar laminate is formed having an etch-stopper layer for dry etching interposed between the membrane layer and the support-forming layer.

3. The method of claim 2, wherein the etch-stopper layer is selected from a group consisting of silicon oxide and metal thin films resistant to dry etchants.

4. The method of claim 1, wherein the membrane material is selected from a group consisting of Si, C, Be, Al, $Si_3N_4$, SiC, $Al_2O_3$, and $SiO_2$.

5. The method of claim 1, wherein the etch-resistant layer is silicon oxide.

6. The method of claim 1, wherein step (c) is performed by dry etching.

7. The method of claim 1, wherein step (d) comprises anisotropically dry etching the exposed portions of the support-forming layer by plasma-enhanced dry etching.

8. The method of claim 7, wherein the plasma-enhanced dry etching is performed at an extremely low temperature of $-100°$ C. to $-120°$ C.

9. The method of claim 8, wherein the plasma-enhanced dry etching is performed using a reactive gas comprising at least one of $Cl_2$ and $SF_6$.

10. The method of claim 7, wherein the plasma-enhanced dry etching is performed using a mixture of a silicon-etching gas and a silicon side-wall protecting gas.

11. The method of claim 10, wherein the silicon-etching gas comprises at least one of $Cl_2$ and $SF_6$, and the side-wall protecting gas comprises at least one of $CHF_3$ and $C_3H_8$.

12. The method of claim 11, wherein the plasma-enhanced dry etching is performed at room temperature.

13. A mask substrate produced by the method of claim 1.

14. A mask produced by a method comprising the steps:

(a) providing the mask substrate of claim 13; and (b) forming a mask pattern on the mask substrate.

15. A method for manufacturing a mask substrate suitable for making a mask usable in microlithography using a charged particle beam or X-rays, the method comprising:

(a) forming a planar laminate comprising a membrane layer, an etch-stopper layer for dry etching applied to the membrane layer, a silicon layer applied to the etch-stopper layer, and a silicon oxide layer applied to the silicon layer;

(b) forming an etch pattern in the silicon oxide layer, the etch pattern comprising voids in the silicon oxide layer extending depthwise in the silicon oxide layer to the underlying silicon layer so as to expose corresponding portions of the silicon layer, the voids being defined by remaining portions of the silicon oxide layer on the silicon layer;

(c) anisotropically dry etching the exposed portions of the silicon layer by exposing the laminate to plasma-enhanced dry etching conditions so as to form regions of the silicon layer protected by the remaining portions of the silicon oxide layer into support structures corresponding to the etch pattern in the silicon oxide layer, the support patterns dividing the mask substrate into a plurality of subfields, the anisotropic dry etching proceeding depthwise in the silicon layer to the etch-stopper layer;

(d) removing remaining portions of the silicon oxide layer; and (e) removing remaining exposed portions of the etch-stopper layer.

16. The method of claim 15, wherein the etch-stopper layer is silicon oxide.

17. The method of claim 13, wherein the etch-stopper layer is a metallic thin film.

18. The method of claim 13, wherein step (c) is performed at a temperature of no higher than $-100°$ C. in the presence of a silicon-etching gas.

19. The method of claim 18, wherein the temperature is between $-100°$ C. and $-120°$ C.

20. The method of claim 15, wherein step (c) is performed using a mixture of a silicon-etching gas and a side-wall protecting gas.

21. The method of claim 20, wherein the silicon-etching gas comprises at least one of $Cl_2$ and $SF_6$, and the side-wall protective gas comprises at least one of $CHF_3$ and $C_3H_8$.

22. A mask substrate produced by the method of claim 15.

23. A mask produced by a method comprising the steps:

(a) providing the mask substrate of claim 22; and (b) forming a mask pattern on the mask substrate.

* * * * *

UNITED STATES PATENT AND TRADEMARK OFFICE
CERTIFICATE OF CORRECTION

PATENT NO. : 5,912,095

DATED : June 15, 1999

INVENTOR(S) : Norihiro Katakura

It is certified that error appears in the above-identified patent and that said Letters Patent is hereby corrected as shown below:

Column 1, line 65, "i.e." should be --I.e.--.

Column 3, line 65, "supports 54" should be --supports 53--.

Column 3, line 66, "Narrow supports 53" should be --narrow supports 54--.

Column 6, line 17, "layer 53" should be --layer 52--.

Column 7, line 20, "FIGS. 1 and" should be --FIGS. 1 and 2--.

In the Claims:

Column 10, line 40, "claim 13" should be --claim 15--.

Column 10, line 42, "claim 13" should be --claim 15--.

Signed and Sealed this

Eighth Day of February, 2000

Attest:

Q. TODD DICKINSON

Attesting Officer

Commissioner of Patents and Trademarks